(12) United States Patent
Okihara

(10) Patent No.: US 8,049,291 B2
(45) Date of Patent: Nov. 1, 2011

(54) SEMICONDUCTOR OPTICAL SENSOR HAVING AN INTER-REGION LIGHT-SHIELDING PLUG

(75) Inventor: Masao Okihara, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 611 days.

(21) Appl. No.: 12/048,239

(22) Filed: Mar. 14, 2008

(65) Prior Publication Data
US 2008/0237769 A1  Oct. 2, 2008

(30) Foreign Application Priority Data
Mar. 29, 2007  (JP) ................................. 2007-089298

(51) Int. Cl.
*H01L 27/146* (2006.01)
(52) U.S. Cl. .................. 257/435; 438/48; 257/E33.076; 257/294; 257/187; 257/184; 257/257; 257/291
(58) Field of Classification Search .................. 257/294, 257/187, 184, 257, 291
See application file for complete search history.

(56) References Cited

U.S. PATENT DOCUMENTS
6,380,572 B1 * 4/2002 Pain et al. ..................... 257/292
2005/0087781 A1 * 4/2005 Kuwazawa et al. .......... 257/291

FOREIGN PATENT DOCUMENTS
JP      07162024     6/1995
JP      09293847    11/1997
* cited by examiner

*Primary Examiner* — Marcos D. Pizarro
*Assistant Examiner* — Eva Yan Montalvo
(74) *Attorney, Agent, or Firm* — Volentine & Whitt, PLLC

(57) ABSTRACT

A sensor includes a substrate provided with a circuit element forming region and a photodiode forming region, the substrate having a silicon substrate, an insulating layer on the silicon substrate, and a silicon layer on the insulating layer; a photodiode in the silicon layer; a circuit element in the silicon layer; a first interlayer insulating film formed over the silicon layer; a first light-shielding film on the first interlayer film and having an opening in the photodiode forming region; and a first inter-region light-shielding plug arranged between the two regions, for connecting the silicon substrate and the first light-shielding film.

12 Claims, 12 Drawing Sheets

SEMICONDUCTOR OPTICAL SENSOR HAVING AN INTER-REGION LIGHT-SHIELDING PLUG

BACKGROUND OF THE INVENTION

1. Field of the Invention

The present invention relaters to a semiconductor optical sensor, and more particularly, to a semiconductor optical sensor for detecting ultraviolet radiation.

2. Description of the Related Art

In a conventional semiconductor optical sensor, an N+ diffusion layer formed as an E-shaped comb and in which an n-type impurity is diffused to a high concentration and a P+ diffusion layer formed as a Π-shaped comb and in which a p-type impurity is diffused to a high concentration are arranged horizontally, opposing each other and with the comb-tooth portions of thereof meshing into one another, on a silicon semiconductor layer having diffused therein an n-type impurity to a low concentration, in an SOI (silicon on insulator) substrate having formed therein silicon semiconductor layers of a thickness of about 150 nm sandwiching an embedded oxide layer, on a silicon substrate, in such a way that ultraviolet radiation intensity is detected by applying a predetermined voltage to metallic wiring electrically connected to the N+ diffusion layer and the P+ diffusion layer. See, for instance, Japanese Unexamined Patent Publication Kokai No. H07-162024 (hereinafter, also referred to as a patent document-1).

Conventional photodiodes, for their part, have a light-shielding film that covers virtually the entire surface of a semiconductor chip, excluding a photodiode opening portion. Between a photodiode and circuit elements formed on a silicon substrate there is also arranged a dummy photodiode and/or a cathode electrode. Such a constitution prevents external light from being incident on circuit elements, thereby preventing malfunction of the circuit elements. See, for instance, Japanese Unexamined Patent Publication Kokai No. H09-293847 (hereinafter, also referred to as a patent document-2).

In a semiconductor optical sensor using an SOI substrate, however, the silicon layer is thin, of several tens of nm, and absorbs thus hardly any ultraviolet light or visible light; as a result, part of the ultraviolet light or visible light reaches the embedded oxide film. Herein, ultraviolet light denotes light having a wavelength of 400 nm or less. Meanwhile, ultraviolet light or visible light is hardly absorbed by the embedded oxide film. Also, part of the ultraviolet light or visible light is reflected at the interface between the embedded oxide film and/or at the interface between the embedded oxide film and the silicon layer. As a result, part of the ultraviolet light or visible light is not absorbed and becomes repeatedly reflected, propagating within the embedded oxide film and reaching the circuit elements, which may give rise to circuit element malfunction.

Propagation of ultraviolet light or visible light within embedded oxide films needs thus to be addressed in semiconductor optical sensors using SOI substrates, and hence simply arranging a light-shielding film provided on a interlayer insulating film, arranging a dummy photodiode in a substrate, or arranging a cathode electrode formed on the substrate, as disclosed in the patent document-2, was not sufficient for preventing incident light from penetrating into the circuit elements.

SUMMARY OF THE INVENTION

In order to solve the above problems, a representative semiconductor optical sensor of the present invention includes: a substrate provided with a circuit element forming region and a photodiode forming region provided separately from the circuit element forming region, the substrate having a silicon substrate, an insulating layer formed on the silicon substrate, and a silicon layer formed on the insulating layer; a photodiode formed in the silicon layer of the photodiode forming region; a circuit element formed in the silicon layer of the circuit element forming region; a first interlayer insulating film formed over the silicon layer of the substrate; a first insulating light-shielding film formed on the first interlayer film of the circuit element forming region and comprising an opening in the photodiode forming region; and a first inter-region light-shielding plug arranged between the circuit element forming region and the photodiode forming region, for connecting the silicon substrate and the first light-shielding film.

Since the light-shielding plug does not reach the surface of the silicon layer, but reaches the silicon substrate, the present invention prevents ultraviolet light or visible light, propagating through the embedded oxide layer, from penetrating into a circuit element region.

DETAILED DESCRIPTION OF THE INVENTION

Embodiments of the present invention are described in detail next with reference to accompanying drawings.

First Embodiment

Figure 1:
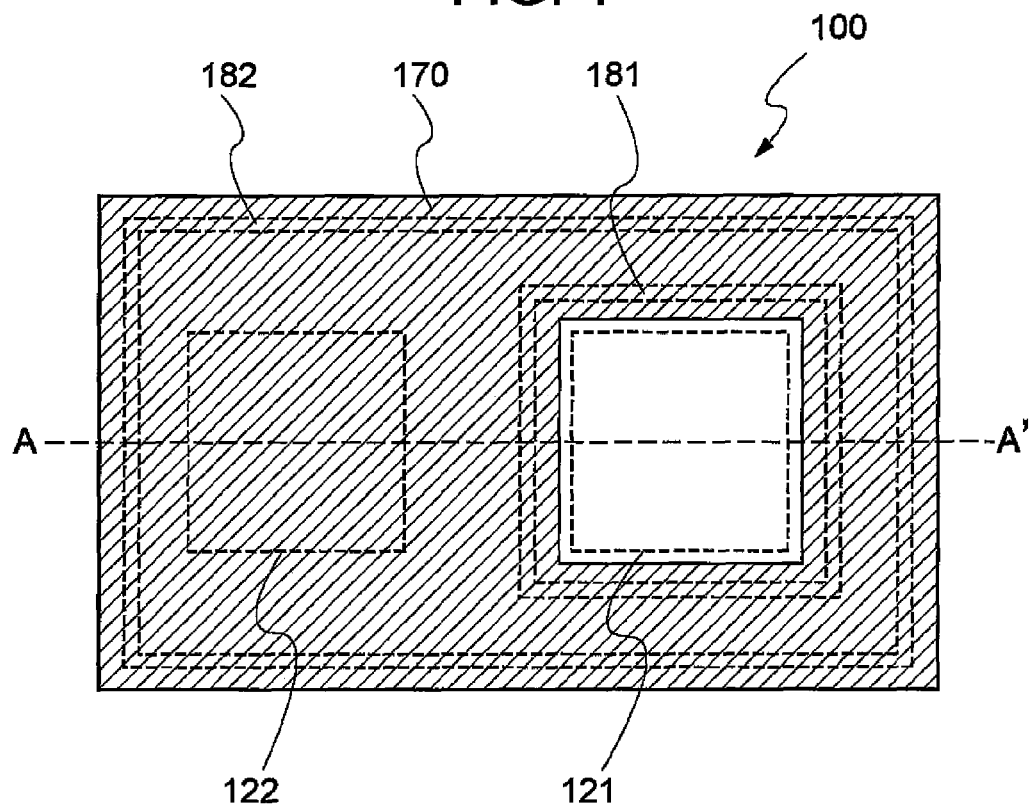
FIG. 1 is a diagram illustrating the structure of a semiconductor optical sensor 100 of a first embodiment.
Figure 2:
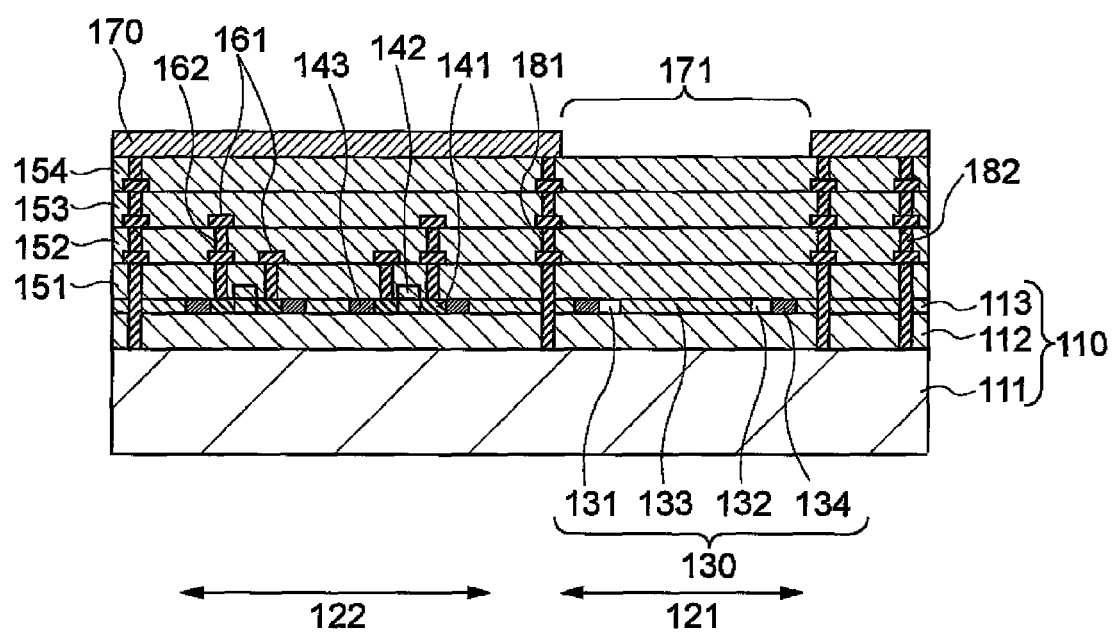
FIG. 2 is a diagram illustrating the structure of the semiconductor optical sensor 100 of the first embodiment.

FIG. 1 is a top-view diagram of a semiconductor optical sensor 100 according to a first embodiment, and FIG. 2 is a cross-sectional diagram of FIG. 1 along the cutting line A-A'.

The semiconductor optical sensor 100 includes a substrate 110 that comprises a silicon substrate 111, an insulating layer 112, and a silicon layer 113. In the substrate 110 there are provided a photodiode forming region 121 and, separated therefrom, a circuit element forming region 122. In the photodiode forming region 121 there is formed a photodiode 130. In the circuit element forming region 122 there are formed circuit elements.

The insulating layer 112 is formed on the silicon substrate 111. The insulating layer 112 is constituted by, for instance, silicon oxide. The thickness of the insulating layer 112 is, for instance, 100 to 200 nm.

The silicon layer 113 is formed on the insulating layer 112. The thickness of the silicon layer 113 is, for instance, 50 nm or less. The photodiode 130 is formed on the silicon layer 113 of the photodiode forming region 121. The constitution of the photodiode 130 is explained further on. Circuit elements are formed on the silicon layer 113 of the circuit element forming region 122. The circuit elements, which are element for controlling the photodiode 130, comprise each, for instance, a transistor. This transistor has a source-drain region 141, a gate oxide film not shown in the figure, and a gate electrode 142. Each transistor is insulated and separated by an element separation layer 143 formed in the silicon layer 113. The element separation layer 143 comprises, for instance, silicon oxide.

On the silicon layer 113 there are formed interlayer insulating films 151, 152, 153, 154. The interlayer insulating films 151, 152, 153, 154 comprise, for instance a CVD-type silicon oxide film, a plasma oxide film or the like.

A wiring 161 is formed between the interlayer insulating films 151, 152, 153, 154. The wiring 161 comprises, for instance, Al, or a multilayer structure of Al and Ti or the like. In the interlayer insulating films 151, 152, 153, 154 there are formed plugs 162 for connection between the wiring 161 and/or for connecting the source-drain regions 141 of the transistors with the wiring 161. The plug 162 is formed by, for instance, tungsten.

On the uppermost interlayer insulating film 154 (first interlayer insulating film) there is formed a first light-shielding film 170. The first light-shielding film 170 comprises, for instance, Al, or a multilayer structure of Al and Ti or the like. The first light-shielding film 170 is formed covering substantially the entire surface of the first interlayer insulating film 154, and has a first opening 171 on the photodiode forming region 121. The first light-shielding film 170 prevents that incident ultraviolet light or visible light striking perpendicularly through the surface of the semiconductor optical sensor 100 should penetrate into the circuit elements of the circuit element forming region 122.

A first light-shielding plug 181 is formed between the photodiode forming region 121 and the circuit element forming region 122. The first light-shielding plug 181 comprises, for instance, a plug and wiring. The first light-shielding plug 181, which runs through the interlayer insulating films 151, 152, 153, 154, the silicon layer 113 and the insulating layer 112, connects the first light-shielding film 170 and the silicon substrate 111. Arranging the first light-shielding plug 181 between the photodiode forming region 121 and the circuit element forming region 122 prevents incident ultraviolet light or visible light striking obliquely through the surface of the semiconductor optical sensor 100 from penetrating into the circuit elements of the circuit element forming region 122 via the first opening 171 of the first light-shielding film 170.

The first light-shielding plug 181 is preferably formed not only between the photodiode forming region 121 and the circuit element forming region 122, but also so as to surround the periphery of the photodiode forming region 121. This allows further preventing penetration of ultraviolet light or visible light into the circuit element forming region 122.

In the vicinity of the outer periphery of the semiconductor optical sensor 100 there is formed a second light-shielding plug 182 surrounding the photodiode forming region 121 and the circuit element forming region 122. The second light-shielding plug 182 comprises, for instance, a plug and wiring. The second light-shielding plug 182, which runs through the interlayer insulating films 151, 152, 153, 154, the silicon layer 113 and the insulating layer 112, connects the first light-shielding film 170 and the silicon substrate 111. Forming the second light-shielding plug 182 in the vicinity of the outer periphery of the semiconductor optical sensor 100 prevents penetration of incident ultraviolet light or visible light striking obliquely through the surface of the semiconductor optical sensor 100.

Figure 3:
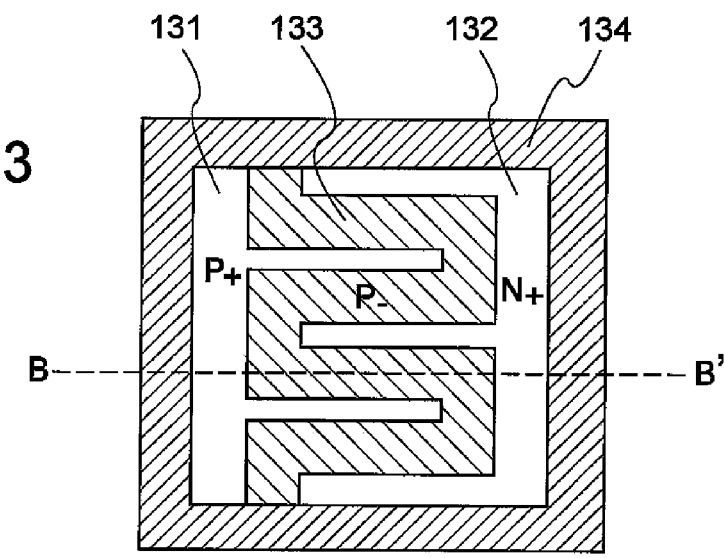
FIG. 3 is a diagram illustrating the structure of a photodiode 130 of the first embodiment.
Figure 4:
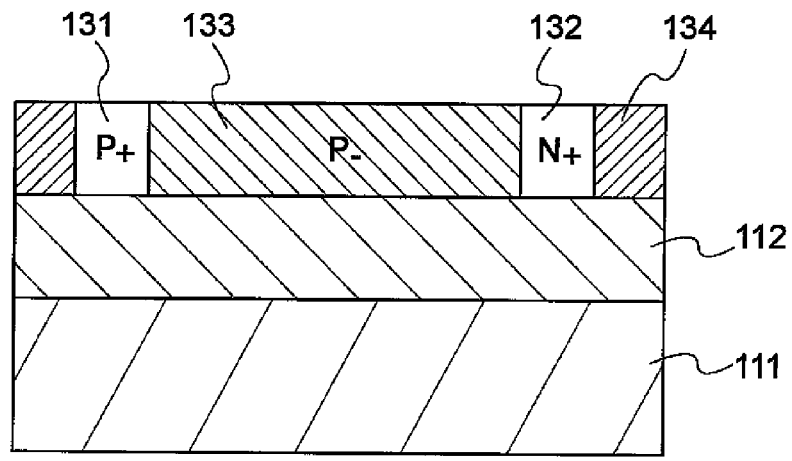
FIG. 4 is a diagram illustrating the structure of the photodiode 130 of the first embodiment.

The photodiode 130 is now explained. FIG. 3 illustrates the photodiode 130 as viewed from the front surface of the semiconductor optical sensor 100. For convenience in the explanation, the interlayer insulating films are not depicted in the figure. Here, FIG. 4 is a cross-sectional diagram of FIG. 3 along the cutting line B-B'.

In the silicon layer 113 there is formed a P+ diffusion layer 131, which has a comb-shape, provided through diffusion of a p-type impurity such as boron (B) or the like to a relatively high concentration. In the silicon layer 113 there is also formed an N+ diffusion layer 132, which has a comb-shape, provided through diffusion of an n-type impurity such as phosphorus (P), arsenic (As) or the like to a relatively high concentration. Between the P+ diffusion layer 131 and the N+ diffusion layer 132 of the silicon layer 113 there is formed a P− diffusion layer 133 as a low-concentration diffusion layer. In the silicon layer 113 there is formed an element separation layer 134 that surrounds the P+ diffusion layer 131, the N+ diffusion layer 132 and the P− diffusion layer 133. The photodiode 130 comprises the P+ diffusion layer 131, the N+ diffusion layer 132, the P− diffusion layer 133 and the element separation layer 134.

When ultraviolet radiation impinges the photodiode 130, the depletion layer formed in the P− diffusion layer 133 absorbs ultraviolet light, whereupon there form electron-hole pairs. These formed electron-hole pairs generate a current, such that the amount of ultraviolet light can be measured on the basis of the current amount.

The thickness of the silicon layer 113 in the present embodiment is set at 50 nm or less, with a view to providing a photodiode 130 having sensitivity only to wavelengths not exceeding 400 nm. Such a thickness of 50 nm is a thickness that results in an optical absorbance of 10% or less for light having a wavelength of 400 nm or more, and an optical absorbance of 10% or more for ultraviolet light having a wavelength of 400 nm or less. A thickness of the silicon layer 113 of 50 nm or less affords thus substantially no sensitivity to light having a wavelength of 400 nm or more, and hence allows detecting selectively ultraviolet light having a wavelength of 400 nm or less.

The thickness of the silicon layer 113 is preferably 20 nm or more. The reason for such a thickness is that, when the silicon layer 113 is thinner than 20 nm, it becomes difficult to absorb thickness variation during the formation of the silicon layer 113 on the silicon substrate 111.

Figure 5:
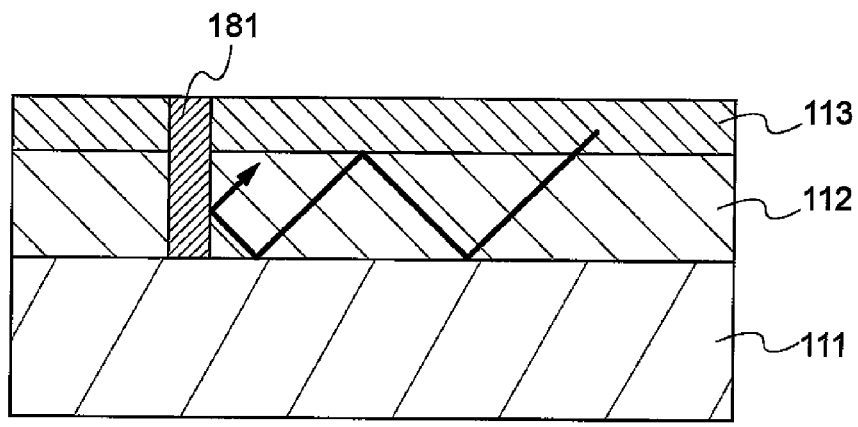
FIG. 5 as a diagram illustrating the principle that allows preventing circuit element malfunction in the first embodiment.

A description follows next on the principle that prevents malfunction of circuit elements, on account of ultraviolet light or visible light, in the semiconductor optical sensor 100 of the present embodiment. FIG. 5 is an enlarged diagram of the silicon substrate 111, insulating layer 112 and silicon layer 113 in the vicinity of the first light-shielding plug 181. In the figure, the arrow denotes ultraviolet light or visible light incident into the insulating layer 112.

Firstly, the first light-shielding plug 181 prevents incident ultraviolet light or visible light striking obliquely through the surface of the semiconductor optical sensor 100 from penetrating, via the first opening 171 of the first light-shielding film 170, into the circuit element forming region 122.

The silicon layer 113 in the semiconductor optical sensor 100 of the present invention is extremely thin, having 50 nm thickness or less, and hence hardly absorbs any ultraviolet light or visible light. In an SOI substrate used in the semiconductor optical sensor 100 of the present invention, moreover, there exist interfaces between the silicon layer 113 and the insulating layer 112, and between the insulating layer 112 and the silicon substrate 111, in addition to the interfaces between interlayer insulating films and the silicon substrate that are present in ordinary bulk substrates. That is, part of the ultraviolet light or visible light that is not absorbed by the silicon layer 113 reaches the insulating layer 112 and is reflected by the interface between the insulating layer 112 and the silicon substrate 111. The reflectance of ultraviolet light or visible light at the interface between the insulating layer 112 and the silicon substrate 111 is larger that that between the silicon layer 113 and the insulating layer 112, and hence the ultraviolet light or visible light propagating through the insulating layer 112 cannot be ignored.

Since the insulating layer 112 absorbs almost no ultraviolet light or visible light, part of the ultraviolet light or visible light propagates through the insulating layer 112, virtually without attenuation, while being repeatedly reflected at the interface between the insulating layer 112 and the silicon layer 113 and at the interface between the insulating layer 112 and the silicon substrate 111. This may give rise to malfunction of the circuit elements as a result of part of the ultraviolet light or visible light reaching the circuit element forming region.

In the semiconductor optical sensor 100 of the present invention, however, the first light-shielding plug 181 runs through the insulating layer 112, and reaches hence not down to the silicon layer 113, but down to the surface of the silicon substrate 111. Such a constitution of the semiconductor optical sensor 100 of the present invention prevents propagation of ultraviolet light or visible light, via the insulating layer 112, to the circuit element forming region 122, thereby preventing the occurrence of circuit element malfunction.

A method for manufacturing the semiconductor optical sensor 100 of the present embodiment is explained next with reference to FIGS. 6A-6C and 7.

Figure 6A:
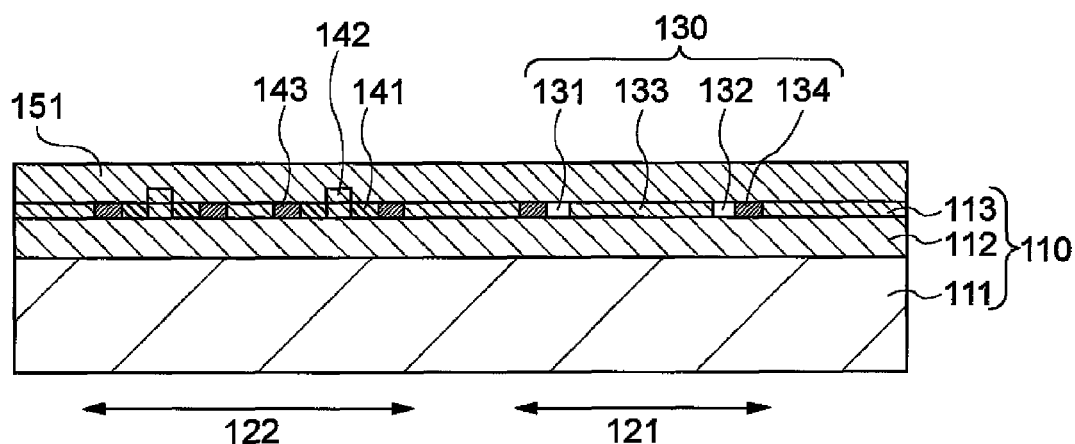
FIGS. 6A-6C are diagrams illustrating a manufacturing method of the semiconductor optical sensor 100 of the first embodiment.

Firstly there is prepared a substrate 100 having formed therein circuit elements in the silicon layer 113 of the circuit element forming region 122, and having a photodiode 130 formed in the silicon layer 113 of the photodiode forming region 121, as illustrated in FIG. 6A. On the substrate 100 there is formed an interlayer insulating film 151.

Figure 6B:
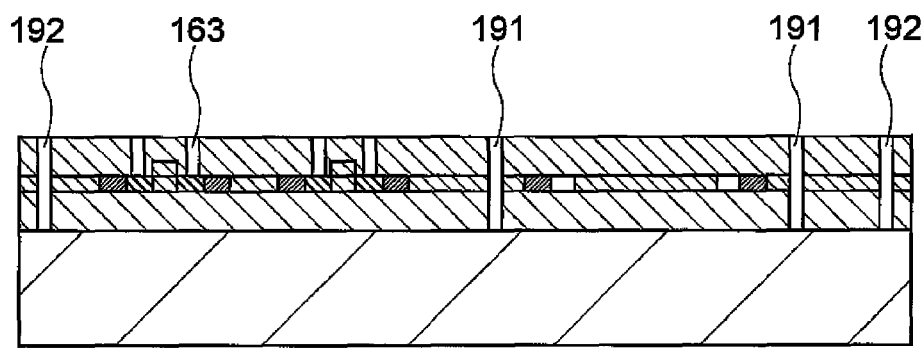

Next, as illustrated in FIG. 6B, there are formed simultaneously, through etching, a first groove 191 surrounding the photodiode forming region 121 and penetrating the interlayer insulating film 151, the silicon layer 113 and the insulating layer 112; and a second groove 192, in the vicinity of the outer periphery of the substrate, surrounding the circuit element forming region 122 and the photodiode forming region 121, and running through the interlayer insulating film 151, the silicon layer 113 and the insulating layer 112. On the source-drain regions 141 there are formed through-holes 163 that run through the interlayer insulating film 151. When the insulating layer 112 is thin, for instance when the thickness of the insulating layer 112 does not exceed 200 nm, the through-holes 163 can be formed through simultaneous etching, and hence the first groove 191, the second groove 192 and the through-holes 163 are preferably formed simultaneously through etching.

Figure 6C:
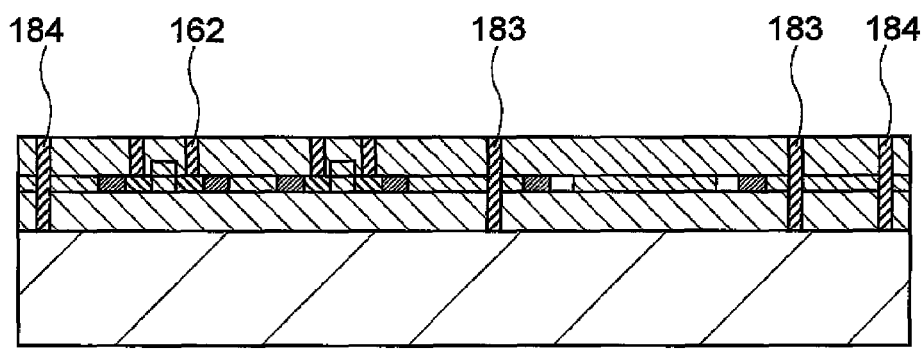

Next, as illustrated in FIG. 6C, a conductor such as tungsten is simultaneously embedded in the first groove 191, the second groove 192 and the through-holes 163, to form thereby a plug 183 of the first light-shielding plug 181, a plug 184 of the second light-shielding plug 182, and plugs 162.

Figure 7A:
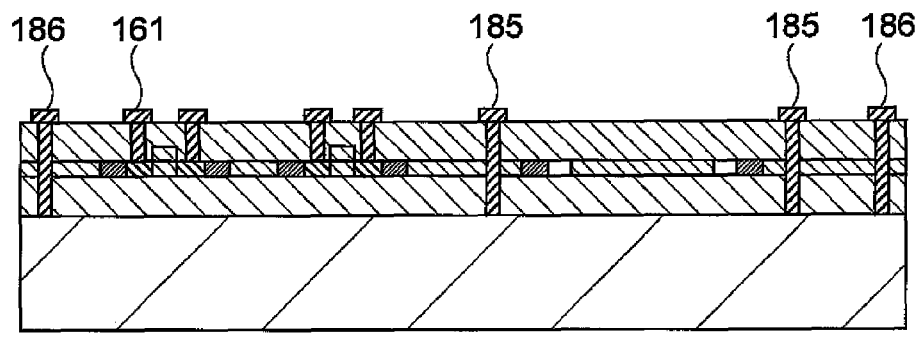
FIGS. 7A-7C are diagrams illustrating a manufacturing method of the semiconductor optical sensor 100 of the first embodiment.

On the plug 183, the plug 184 and the plugs 162 there are formed, simultaneously, a wiring 185 of the first light-shielding plug 181, a wiring 186 of the second light-shielding plug 182, and wiring 161, as illustrated in FIG. 7A.

Figure 7B:
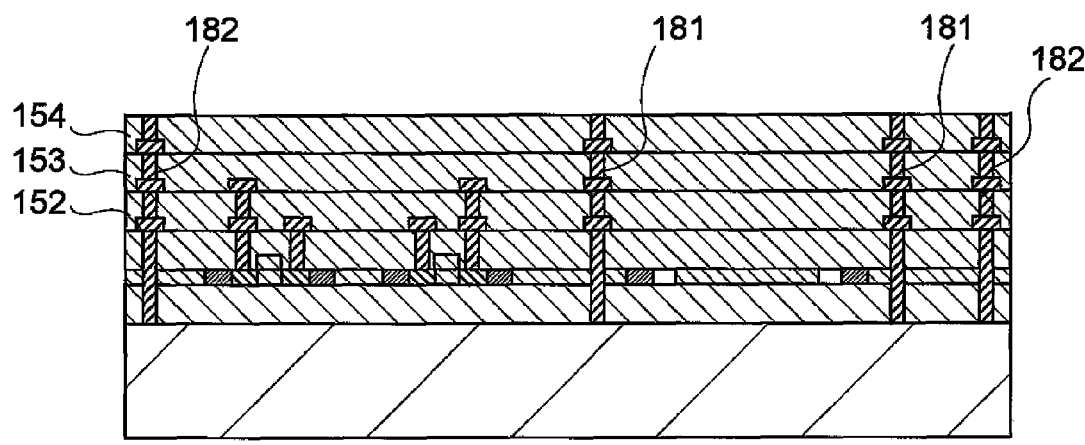

Next, as illustrated in FIG. 7B, the step of forming the interlayer insulating films, the step of forming the plugs 183, 184, 162, and the step of forming the wirings 185, 186, 161 are repeated to form thereby the interlayer insulating films 152, 153, 154, the first light-shielding plug 181 and the second light-shielding plug 182.

Figure 7C:
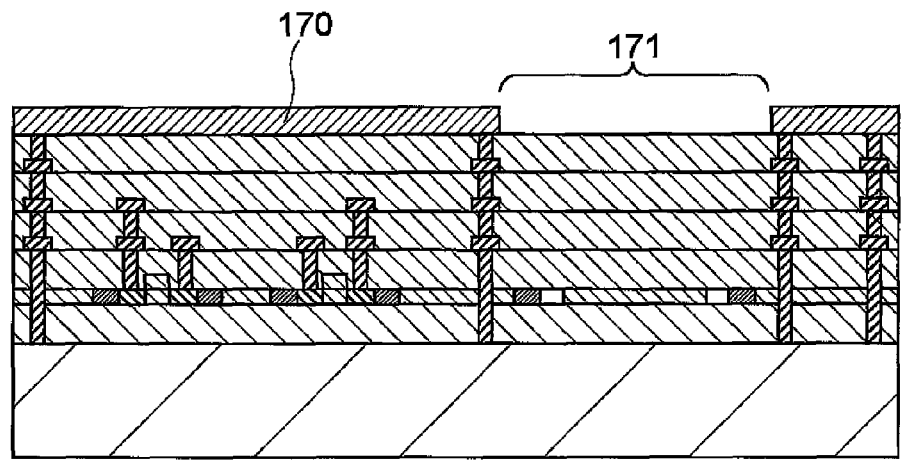

Next, as illustrated in FIG. 7C, a conductive film of the first light-shielding film 170 is formed over the entire surface of the uppermost interlayer insulating film 154 (first interlayer insulating film). Thereafter, the conductive film of the photodiode forming region 121 is removed through etching, to form the first light-shielding film 170 comprising the first opening 171.

The above process allows thus manufacturing the semiconductor optical sensor 100 of the present embodiment.

The first light-shielding film 170, the first light-shielding plug 181 and the second light-shielding plug 182 according to the present embodiment are preferably connected to ground. For effecting such ground connection, at least one among the first light-shielding film 170, the first light-shielding plug 181 or the second light-shielding plug 182 may be connected to ground wiring, or to a pad connected to ground.

The interlayer insulating film of the present embodiment comprises four layers 151, 152, 153, 154, but need only comprise at least two layers.

Second Embodiment

A semiconductor optical sensor 200 according to the present embodiment comprises a third light-shielding plug 220 and a wiring portion 230, in addition to the constitution of the first embodiment. Elements identical to those of the first embodiment are denoted with identical reference numerals, and their explanation is omitted herein.

Figure 8:
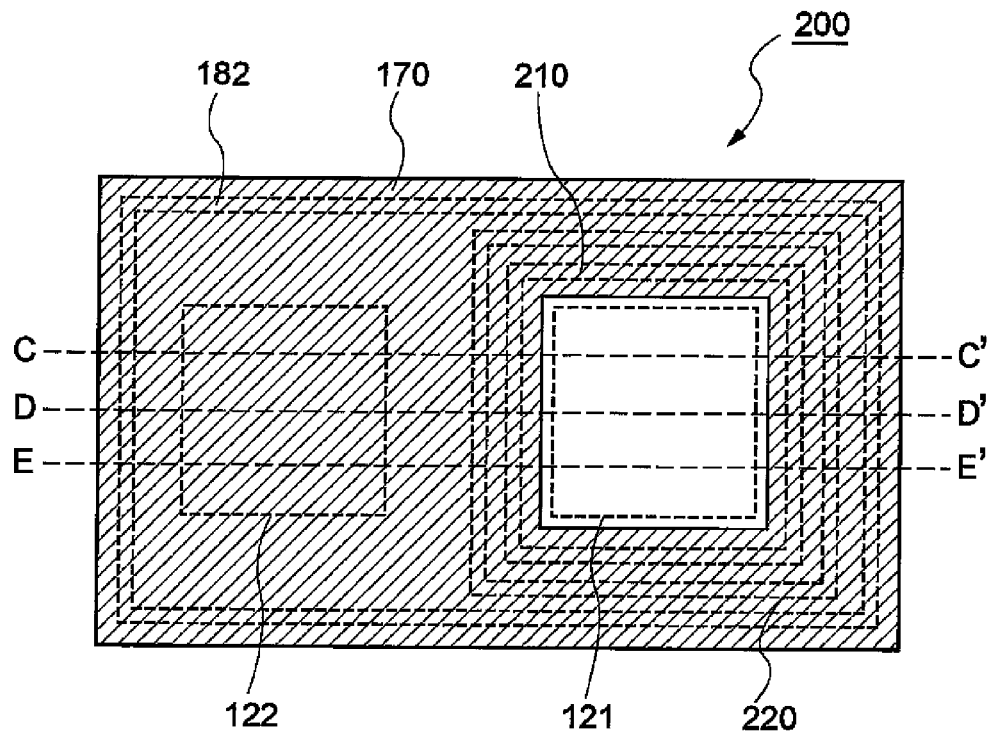
FIG. 8 is a diagram illustrating the structure of a semiconductor optical sensor 200 of a second embodiment.
Figure 9:
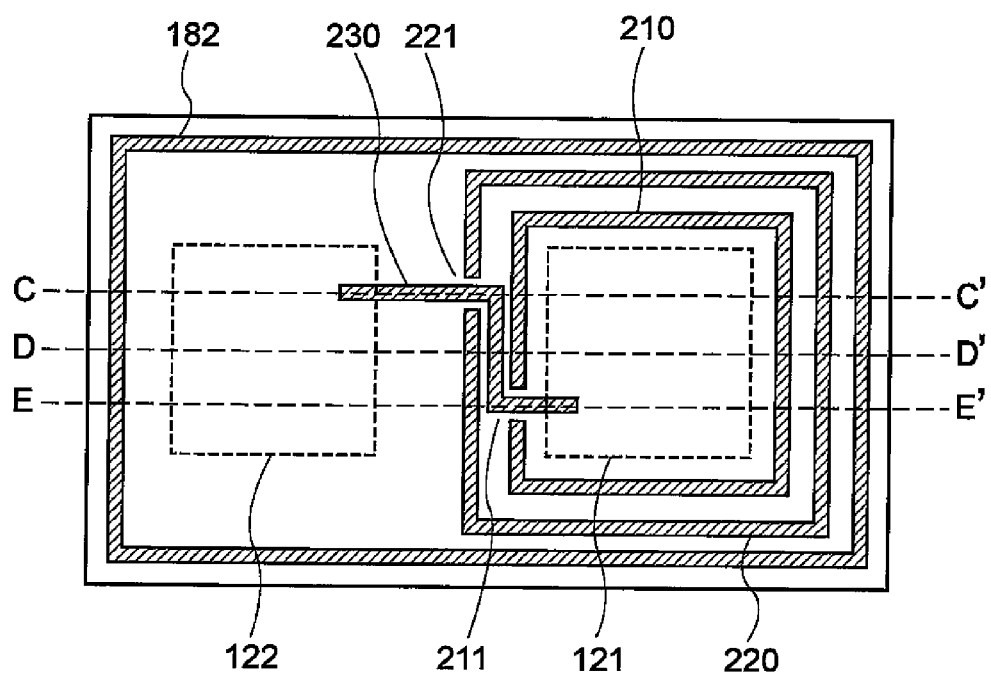
FIG. 9 is a diagram illustrating the structure of the semiconductor optical sensor 200 of the second embodiment.
Figure 10:
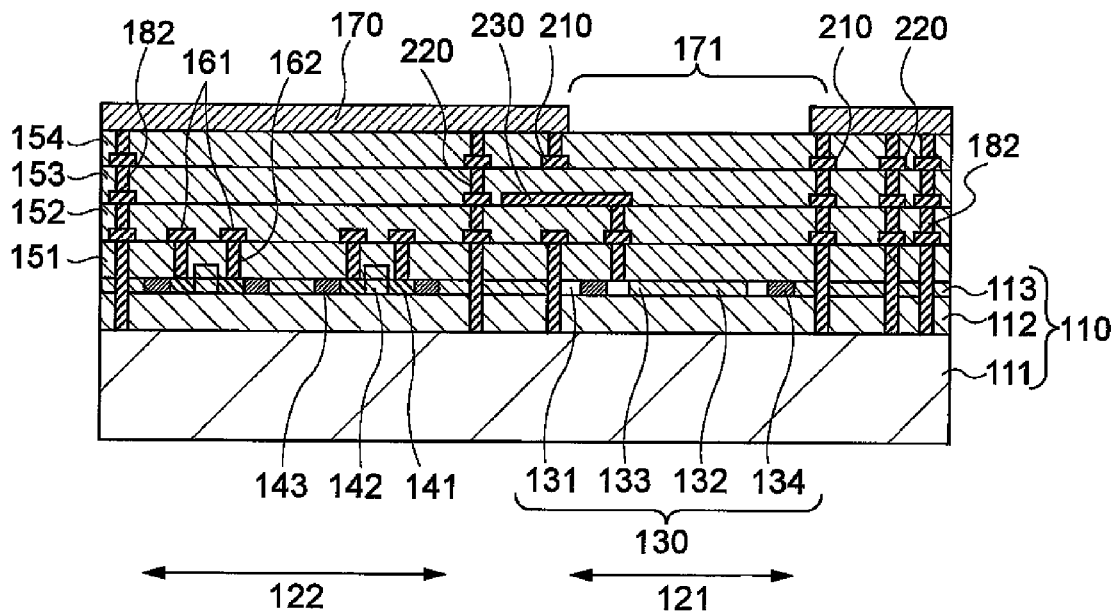
FIG. 10 is a diagram illustrating the structure of the semiconductor optical sensor 200 of the second embodiment.
Figure 11:
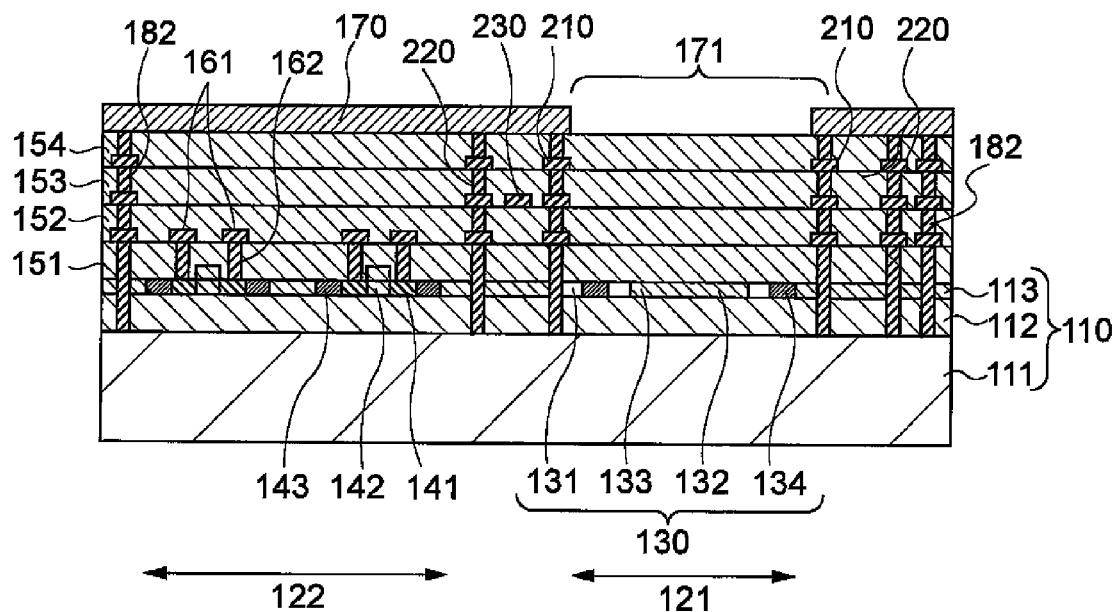
FIG. 11 is a diagram illustrating the structure of the semiconductor optical sensor 200 of the second embodiment.
Figure 12:
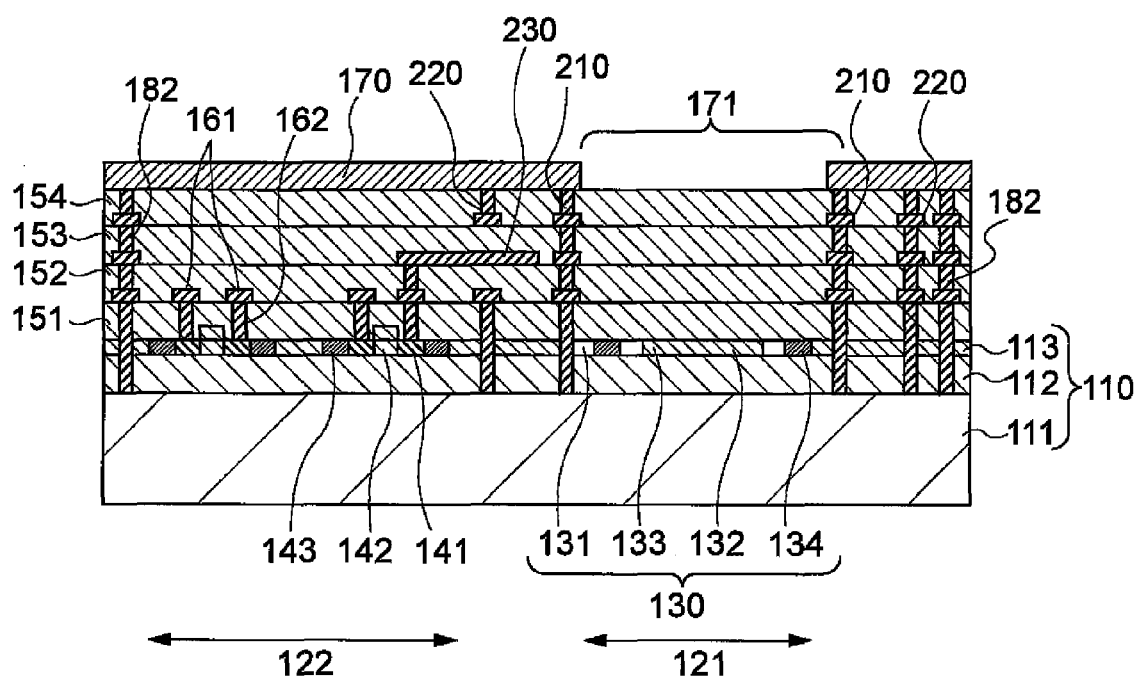
FIG. 12 is a diagram illustrating the structure of the semiconductor optical sensor 200 of the second embodiment.

FIG. 8 is a top-view diagram of the semiconductor optical sensor 200 of a second embodiment, and FIG. 9 is a top-view diagram of the semiconductor optical sensor 200, with the first light-shielding film 170 and the interlayer insulating films 153 and 154 removed, for illustrating the wiring portion 230. FIG. 10 is a cross-sectional diagram along the cutting line E-E', FIG. 11 is a cross-sectional diagram along the cutting line D-D', and FIG. 12 is a cross-sectional diagram along the cutting line C-C'.

A first light-shielding plug 210 is formed so as to surround the periphery of the photodiode forming region 121. The first light-shielding plug 210 has a second opening 211 between the photodiode forming region 121 and the circuit element forming region 122. As illustrated in FIG. 9, the second opening 211 is set by not forming wiring as the first light-shielding plug 210, over a predetermined gap. The opening 211 is set by not forming a plug in interlayer insulating films 152, 153, as illustrated in FIG. 10.

In the periphery of the first light-shielding plug 210 there is formed a third light-shielding plug 220 so as to surround the first light-shielding plug 210. The third light-shielding plug 220 comprises, for instance, a plug and wiring. The third light-shielding plug 220 runs through the interlayer insulating films 151, 152, 153, 154, the silicon layer 113 and the insulating layer 112, and connects the first light-shielding film 170 and the silicon substrate 111. The third light-shielding plug 220 has a third opening 221 between the photodiode forming region 121 and the circuit element forming region 122. As illustrated in FIG. 9, the third opening 221 is set by not forming wiring, belonging to the third light-shielding plug 220, over a predetermined gap. The opening 221 is set by not forming a plug in interlayer insulating films 152, 153, as illustrated in FIG. 12.

The wiring portion 230 is formed on the interlayer insulating film 152 (second interlayer insulating film). The wiring portion 230 connects electrically the photodiode 130 of the photodiode forming region 121 and the circuit elements of the circuit element forming region 122 via the second opening 211 and the third opening 221. The wiring portion 230 comprises, for instance, Al, or a multilayer structure of Al and Ti or the like. The wiring portion 230 is electrically connected to, for instance, the P+ diffusion layer 131 of the photodiode 130. The wiring portion 230 is also electrically connected to, for instance, the source-drain region 141 of a transistor.

As illustrated in FIG. 9, the second opening 211 of the first light-shielding plug 210 and the third opening 221 of the third light-shielding plug 220 are arranged separately from each other by a predetermined distance in the direction perpendicular to the direction in which the circuit element forming region 122 and the photodiode forming region 121 are arranged. Preferably, that predetermined distance is, for instance, 10 µm or more.

The first light-shielding plug 210 and the third light-shielding plug 220 serve as a first inter-region light-shielding means and a second inter-region light-shielding means (i.e., first and second inter-region light-shielding plugs), respectively, between the photodiode forming region 121 and the circuit element forming region 122.

In the present embodiment, arranging the second opening 211 and the third opening 221 separated from each other by a predetermined distance allows preventing ultraviolet light or visible light striking the photodiode forming region 121 from penetrating into the circuit element forming region 122 via the second opening 211 and the third opening 221.

A manufacturing method of the semiconductor optical sensor 200 of the second embodiment is now described. The manufacturing method below will be explained with reference to the cross-sectional diagram of FIG. 10.

Figure 13A:
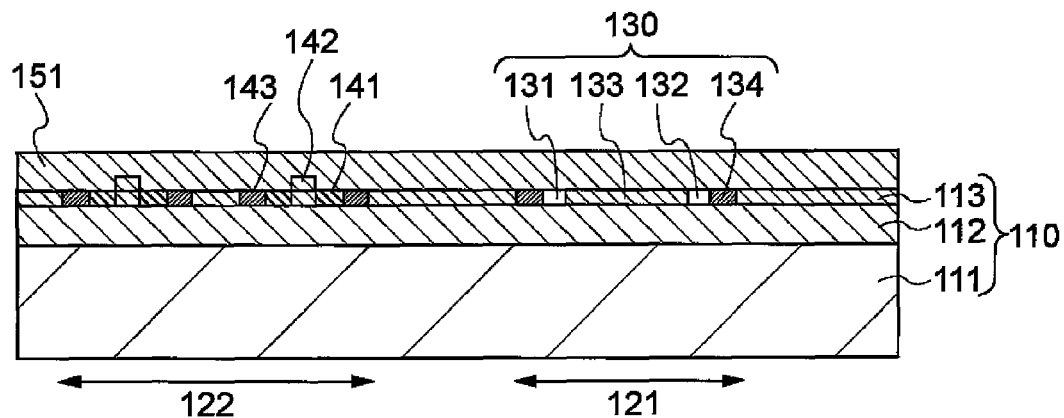
FIGS. 13A-13C are diagrams illustrating a manufacturing method of the semiconductor optical sensor 200 of the second embodiment.

Firstly there is prepared a substrate 100 having formed therein circuit elements in the silicon layer 113 of the circuit element forming region 122, and having a photodiode 130 formed in the silicon layer 113 of the photodiode forming region 121, as illustrated in FIG. 13A. On the substrate 100 there is formed an interlayer insulating film 151.

Figure 13B:
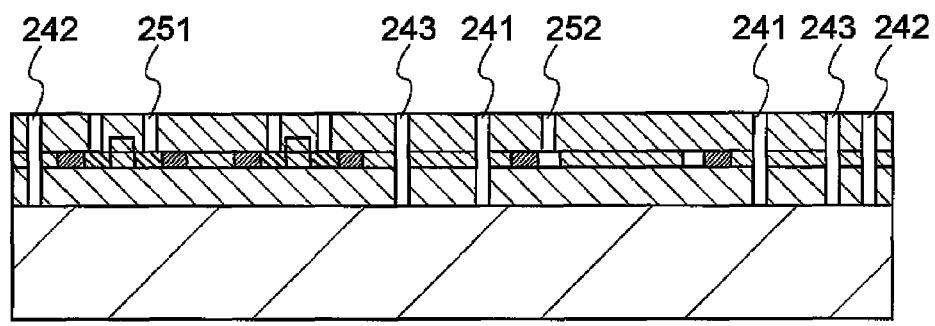

Next, as illustrated in FIG. 13B, there are formed simultaneously, through etching, a first groove 241 surrounding the photodiode forming region 121 and running through the interlayer insulating film 151, the silicon layer 113 and the insulating layer 112; a second groove 242, in the vicinity of the outer periphery of the substrate, surrounding the circuit element forming region 122 and the and the photodiode forming region 121, and running through the interlayer insulating film 151, the silicon layer 113 and the insulating layer 112; and a third groove 243 surrounding the first groove 241 and running through the interlayer insulating film 151, the silicon layer 113 and the insulating layer 112. On the source-drain regions 141 there are formed, by etching, through-holes 251 that run through the interlayer insulating film 151. A through-hole 252 is formed by etching, simultaneously with the through-holes 251, on the P+ diffusion layer 131. When the insulating layer 112 is thin, for instance when the thickness of the insulating layer 112 does not exceed 200 nm, the various etching operations can be carried out simultaneously, and hence the first groove 241, the second groove 242, the third groove 243, the through-holes 251 and the through-hole 252 are preferably formed simultaneously through etching.

Figure 13C:
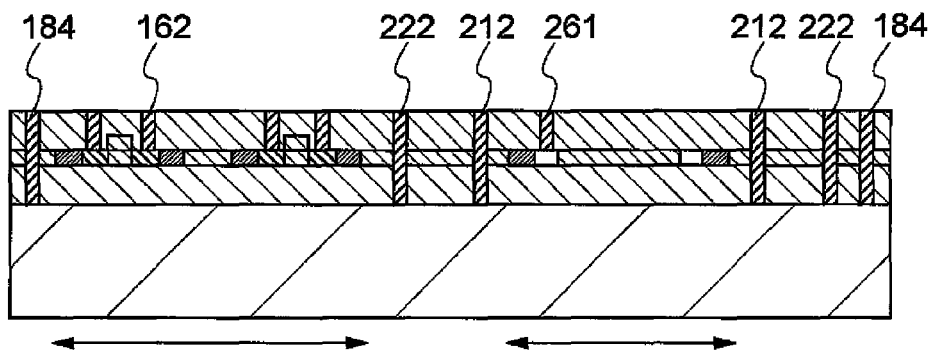

Next, as illustrated in FIG. 13C, a conductor such as tungsten is simultaneously embedded in the first groove 241, the second groove 242, the third groove 243, the through-holes 251 and the through-hole 252, to form thereby a plug 212 of the first light-shielding plug 210, a plug 184 of the second light-shielding plug 182, a plug 222 of the third light-shielding plug 220, plugs 162 and a plug 261.

Figure 14A:
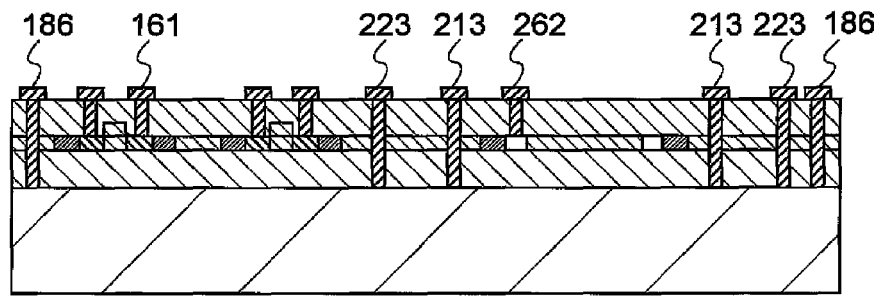
FIGS. 14A-14C are diagrams illustrating a manufacturing method of the semiconductor optical sensor 200 of the second embodiment.

Next, as illustrated in FIGS. 13C and 14A, a wiring 213 of the first light-shielding plug 210, wiring 186 of the second light-shielding plug 182, a wiring 223 of the third light-shielding plug 220, a wiring 161 and wiring 262 are formed simultaneously on the plug 212, the plug 184, the plug 222, the plugs 162 and the plug 261.

Figure 14B:
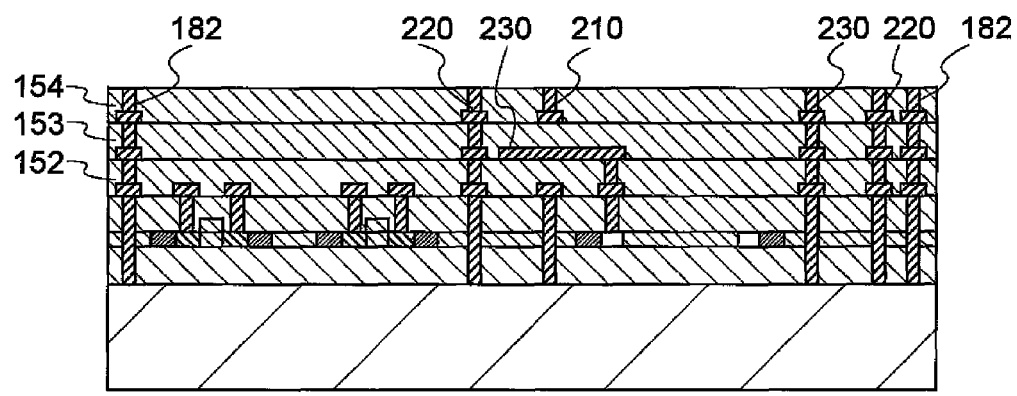

Next, as illustrated in FIG. 14B, the step of forming the interlayer insulating films, the step of forming the plugs 212, 184, 222, 162, 261, and the step of forming the wirings 213, 223 are repeated to form thereby the interlayer insulating films 152, 153, 154, the first light-shielding plug 210, the second light-shielding plug 182, and the third light-shielding plug 220. At that time, the wiring portion 230 is formed on the interlayer insulating film 152 (second interlayer insulating film) simultaneously with the wirings 213 and 223. The second opening 211 of the first light-shielding plug 210 and the third opening 221 of the third light-shielding plug 220 can be provided by forming the wrings 213, 223 on the interlayer insulating film 152 (second interlayer insulating film), and not forming the plugs 212, 222 in the interlayer insulating films 152, 153.

Figure 14C:
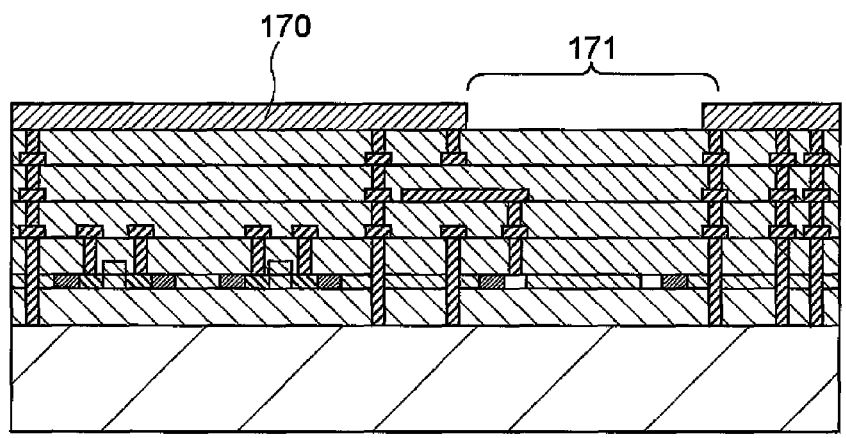

Next, as illustrated in FIG. 14C, a conductive film of the first light-shielding film 170 is formed over the entire surface of the uppermost interlayer insulating film 154 (first interlayer insulating film). Thereafter, the conductive film of the photodiode forming region 121 is removed through etching, to form the first light-shielding film 170 comprising the first opening 171.

The above process allows thus manufacturing the semiconductor optical sensor 200 of the present embodiment.

In the present embodiment, the wiring portion 230 comprises only wiring formed on the second interlayer insulating film 152, but may comprise wiring and a plug. In the present embodiment, also, the second opening 211 and the third opening 221 are set at the same interlayer insulating films (interlayer insulating films 152, 153), but they may be set at mutually different layers.

The first light-shielding film 170, the first light-shielding plug 210, the second light-shielding plug 182 and the third light-shielding plug 220 of the present embodiment are preferably connected to ground. For effecting such ground connection, at least one among the first light-shielding film 170, the first light-shielding plug 210, the second light-shielding plug 182 and the third light-shielding plug 220 may be connected to ground wiring, or to a pad connected to ground.

Third Embodiment

A semiconductor optical sensor 300 according to the present embodiment comprises a second light-shielding film 320 and a fourth light-shielding plug 330, in addition to the constitution of the first embodiment. Elements identical to those of the first embodiment are denoted with identical reference numerals, and their explanation is omitted herein.

Figure 15:
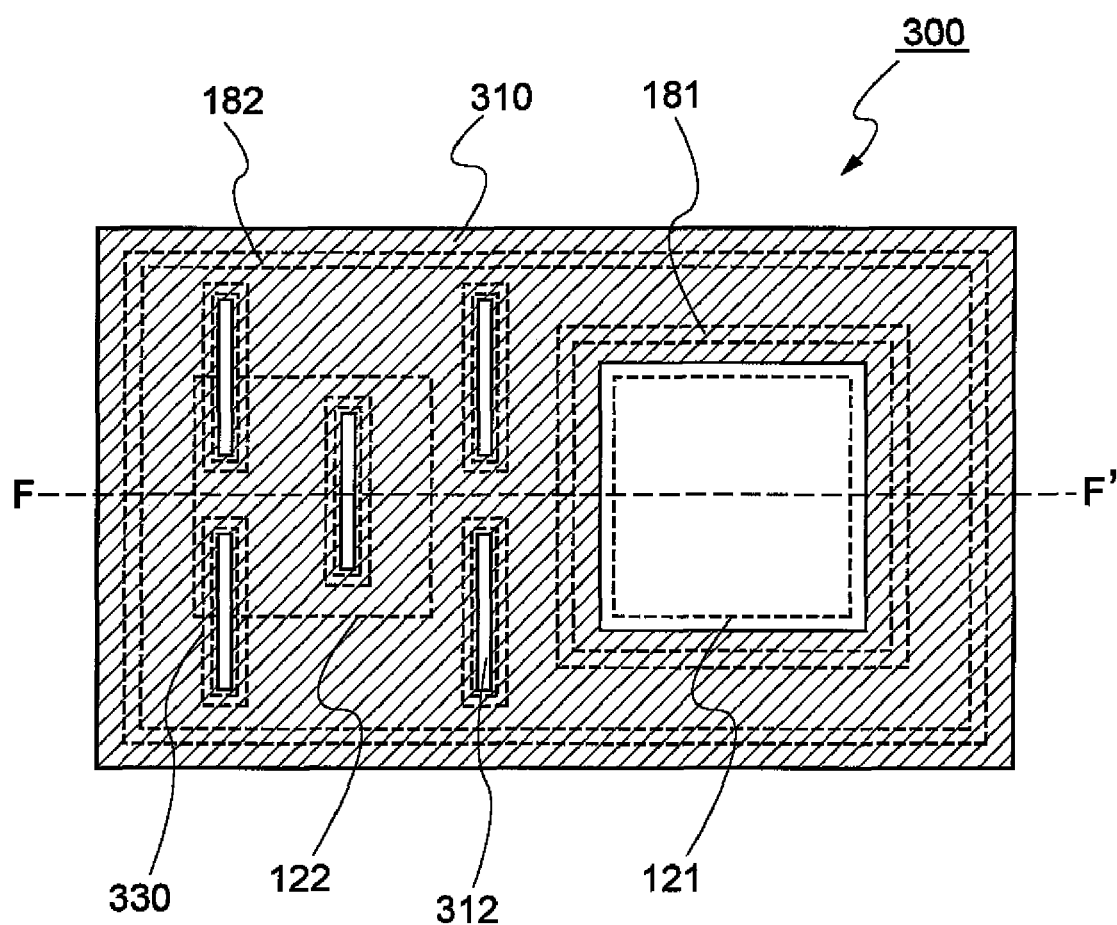
FIG. 15 is a diagram illustrating the structure of a semiconductor optical sensor 300 of a third embodiment.
Figure 16A:
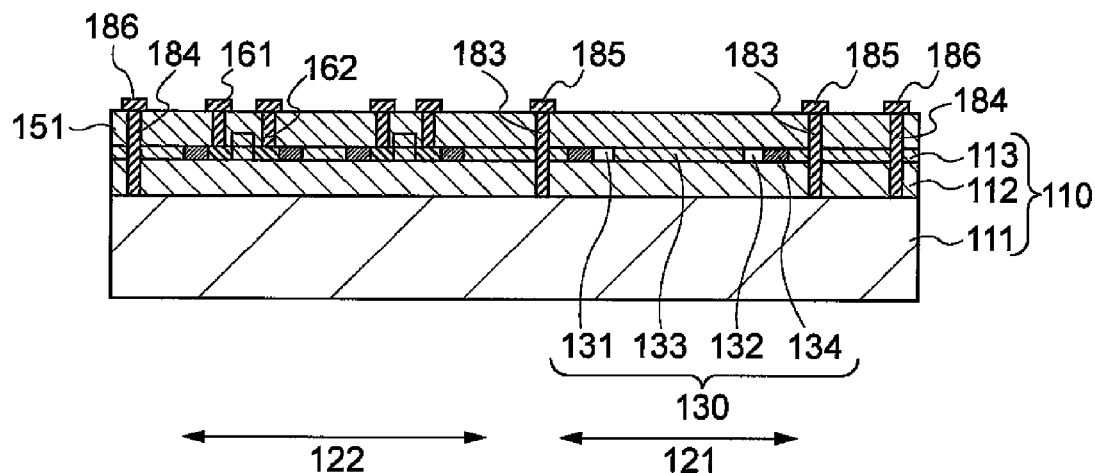
FIGS. 16A-16C are diagrams illustrating the structure of the semiconductor optical sensor 300 of the third embodiment.
Figure 16B:
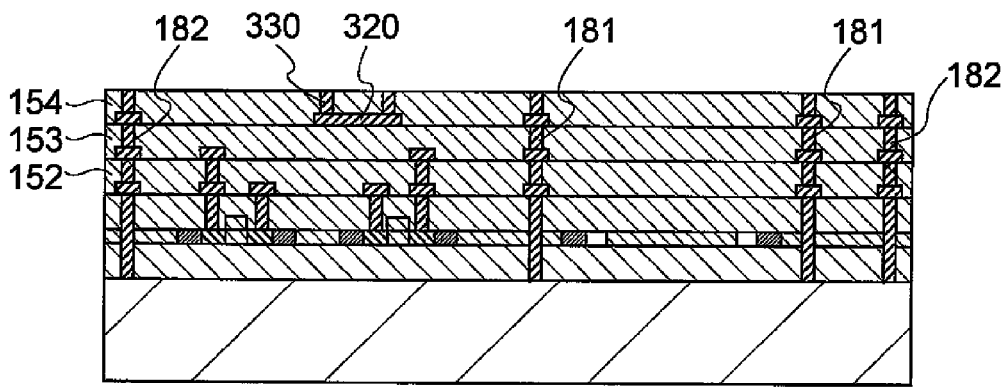
Figure 16C:
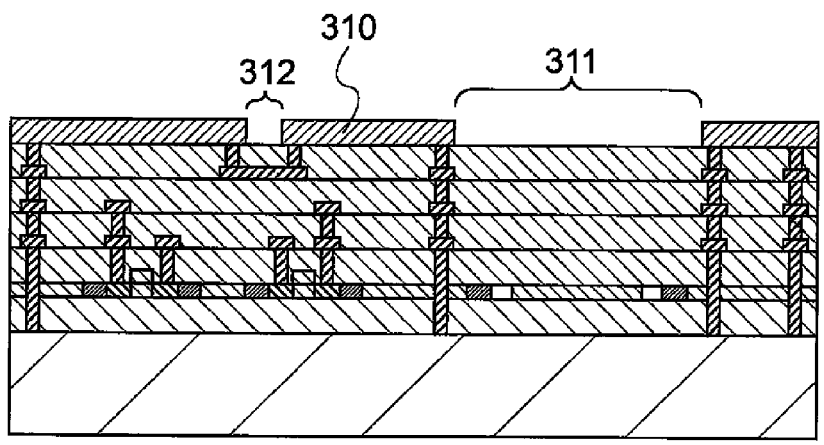

FIG. 15 is a top-view diagram of the semiconductor optical sensor 300 in the third embodiment, and FIGS. 16A-16C are cross-sectional diagrams along the cutting line F-F'.

A first light-shielding film 310 has, in addition to a first opening 311, plural fourth openings 312. The fourth openings 312 are, for instance, rectangular in shape and have a size of, for instance, 40 μm or more in the long-side direction and 4 μm or more in the short-side direction. The spacing between adjacent fourth openings 312, in the short-side direction, is of 10 to 20 μm.

Plural second light-shielding films 320 are provided between the uppermost interlayer insulating film 154 (first interlayer insulating film) and the underlayer thereof, the interlayer insulating film 153 (third interlayer insulating film). The plural second light-shielding films 320 comprise the same material as the wiring 161, for instance Al, or a multi-layer structure of Al and Ti or the like.

Between the first light-shielding film 310 and the second light-shielding films 320 there are formed fourth light-shielding plugs 330 running through the uppermost interlayer insulating film 154 (first interlayer insulating film). The fourth light-shielding plugs 330 are formed so as to surround the periphery of the fourth openings 312. The fourth light-shielding plugs 330 comprise the same material as the plugs 162, for instance tungsten.

Although the circuit element forming region must be covered by a light-shielding film, a light-shielding film having a width exceeding 30 μm may give rise to interlayer insulating film cracking on account of stress occurring in the edge of the light-shielding film. In the present embodiment, therefore, providing plural fourth openings 312 in the first light-shielding film 310 prevents possible cracks that may form in the interlayer insulating film 154, even when the first light-shielding film is a film having a width exceeding 30 μm.

A manufacturing method of the semiconductor optical sensor 300 of the present embodiment is explained next based on FIGS. 17A-17C.

Figure 17A:
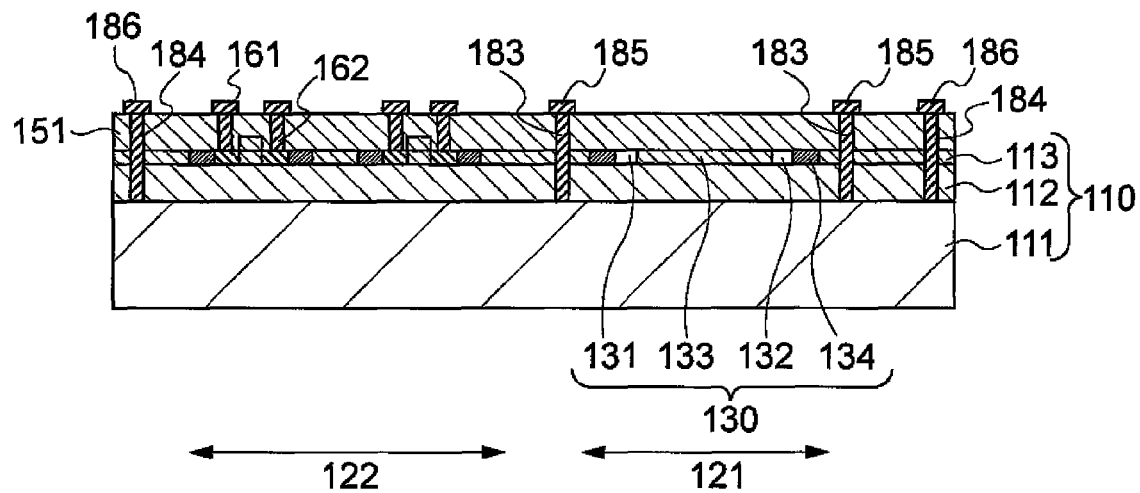
FIGS. 17A-17C are diagrams illustrating a manufacturing method of the semiconductor optical sensor 300 of the third embodiment.

As illustrated in FIG. 17A, the manufacturing method is identical to that of the first embodiment, from the step of preparing a substrate 110 to the step of forming the wirings 161, 185 and 186 on the interlayer insulating film 151, i.e., from FIG. 6A to FIG. 7A.

Figure 17B:
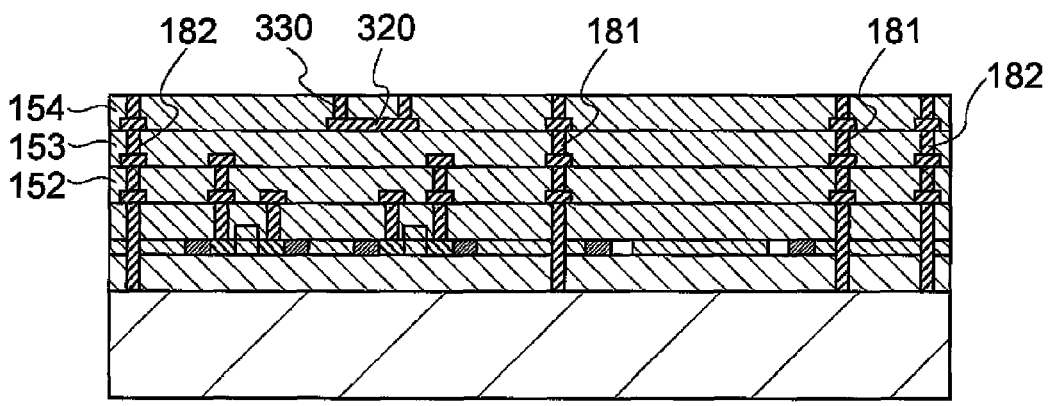

As illustrated in FIG. 17B, the step of forming the interlayer insulating films, the step of forming the plugs 183, 184, 162, and the step of forming the wirings 185, 186, 161 are repeated to form thereby the interlayer insulating films 152, 153, 154, the first light-shielding plug 181, and the second light-shielding plug 182. Herein, prior to the step of forming the uppermost interlayer insulating film 154 (first interlayer insulating film), the second light-shielding films 320 are formed in the underlayer of the interlayer insulating film 154, i.e. in the interlayer insulating film 153 (second interlayer insulating film), simultaneously with the step of forming the wirings 185, 186. Also, in the step of forming the through-holes in the uppermost interlayer insulating film 154 (first interlayer insulating film), there is simultaneously formed through etching, in addition to the first groove 191 and the second groove 192, a third groove surrounding the periphery of the fourth openings 312 that are formed in a subsequent step. Thereafter, a conductor such as tungsten is simultaneously embedded in the first groove 191, the second groove 192, and the third groove, to form thereby the plug 183 of the first light-shielding plug 181, the plug 184 of the second light-shielding plug 182, the fourth light-shielding plugs 330 and the plugs 162.

Figure 17C:
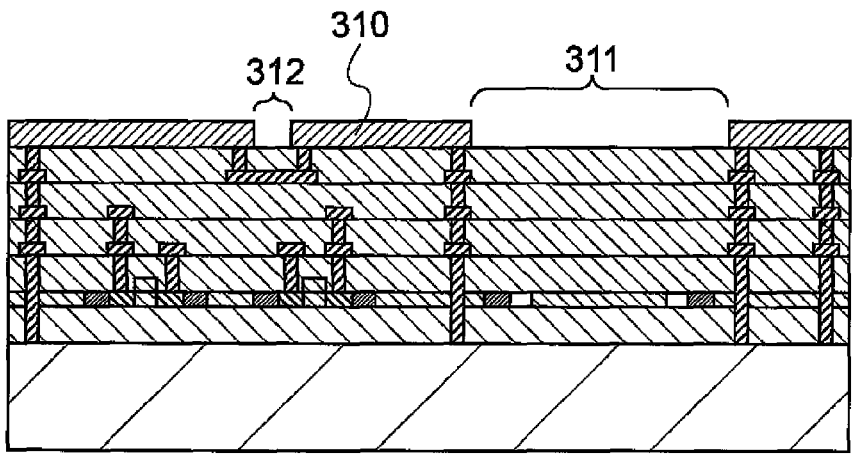

Next, as illustrated in FIG. 17C, a conductive film of the first light-shielding film 310 is formed over the entire surface of the uppermost interlayer insulating film 154 (first interlayer insulating film). Thereafter, the conductive film of predetermined regions is removed through etching, to form the first light-shielding film 310 comprising the first opening 311 and the fourth openings 312.

The above process allows thus manufacturing the semiconductor optical sensor 300 of the present embodiment.

The constitution explained herein involves providing plural fourth openings in the first light-shielding film of the first embodiment, but the plural fourth openings may also be provided in the first light-shielding film of the second embodiment.

Preferred embodiments of the present invention have been described above for reference. It must be understood that a person skilled in the art can conceive of various modifications and alterations to the above embodiments, without any such modifications or alterations departing from the scope of the appended claims.

The present application is based on Japanese Patent Application No. 2007-089298, which is incorporated herein by reference.

What is claimed is:

1. A semiconductor optical sensor, comprising:
a substrate including a circuit element forming region and a photodiode forming region provided separately from said circuit element forming region, said substrate having a silicon substrate, an insulating layer formed on said silicon substrate, and a silicon layer formed on said insulating layer;
a photodiode formed in said silicon layer of said photodiode forming region;
a circuit element formed in said silicon layer of said circuit element forming region;
a first interlayer insulating film formed over said silicon layer of said substrate;
a first light-shielding film formed on said first interlayer insulating film of said circuit element forming region and comprising an opening exposing said photodiode forming region; and
a first inter-region light-shielding plug interposed between said circuit element forming region and said photodiode forming region, and extending through said insulating layer, said silicon layer, and said first interlayer insulating film so as to contact said first light-shielding film and said substrate at respectively opposite ends of said first inter-region light-shielding plug.

2. The semiconductor optical sensor according to claim 1, wherein said first inter-region light-shielding plug surrounds a periphery of said photodiode forming region.

3. The semiconductor optical sensor according to claim 2, further comprising a second inter-region light-shielding plug which surrounds a periphery of said first inter-region light-shielding plug, and which extends between and contacts said silicon substrate and said first light-shielding film.

4. The semiconductor optical sensor according to claim 3, wherein said first inter-region light-shielding plug has a second opening between said circuit element forming region and said photodiode forming region;

said second inter-region light-shielding plug has a third opening between said circuit element forming region and said photodiode forming region; and said semiconductor optical sensor further comprises a wiring portion for electrically connecting said circuit element formed in said circuit element forming region and said photodiode formed in said photodiode forming region, via said second opening and said third opening.

5. The semiconductor optical sensor according to claim 4, wherein said second opening and said third opening are spaced apart from each other by a predetermined distance in a direction perpendicular to a direction in which said circuit element forming region and said photodiode forming region are located.

6. The semiconductor optical sensor according to claim 5, wherein said predetermined distance is 10 μm or more.

7. The semiconductor optical sensor according to claim 4, wherein said wiring portion is formed on a second interlayer insulating film located between said substrate and said first interlayer insulating film.

8. The semiconductor optical sensor according to claim 1, wherein said first light-shielding film has a fourth opening;

and said semiconductor optical sensor further comprises a second light-shielding film formed on a third interlayer insulating film being an underlayer of said first interlayer insulating film;

and a fourth light-shielding plug which surrounds a periphery of said fourth opening, and which extends between and contacts said first light-shielding film and said second light-shielding film.

9. The semiconductor optical sensor according to claim 8, wherein said fourth opening is rectangular and has a long side of 40 μm or more and a short side of 4 μm or more.

10. The semiconductor optical sensor according to claim 1, wherein said insulating layer comprises silicon oxide.

11. The semiconductor optical sensor according to claim 1, wherein said first light-shielding film is connected to ground.

12. The semiconductor optical sensor according to claim 1, wherein the thickness of said silicon layer is 50 nm or less.

* * * * *